(12) United States Patent
Ahn

(10) Patent No.: US 7,660,163 B2
(45) Date of Patent: Feb. 9, 2010

(54) METHOD AND UNIT FOR VERIFYING INITIAL STATE OF NON-VOLATILE MEMORY DEVICE

(75) Inventor: Se-Jin Ahn, Seoul (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 535 days.

(21) Appl. No.: 11/208,742

(22) Filed: Aug. 23, 2005

(65) Prior Publication Data

US 2006/0044875 A1    Mar. 2, 2006

(30) Foreign Application Priority Data

Aug. 24, 2004  (KR) .................... 10-2004-0066664

(51) Int. Cl.
    *G11C 16/06* (2006.01)
(52) U.S. Cl. ..................... 365/185.22; 365/185.24; 365/185.11; 365/185.21; 365/230.06
(58) Field of Classification Search ............ 365/185.22, 365/185.24, 185.11, 185.21, 230.06
    See application file for complete search history.

(56) References Cited

U.S. PATENT DOCUMENTS

| | | | |
|---|---|---|---|
| 5,598,368 A | | 1/1997 | Takahashi et al. |
| 5,621,687 A | * | 4/1997 | Doller ................... 365/185.29 |
| 5,732,019 A | | 3/1998 | Urai |
| 5,798,966 A | | 8/1998 | Keeney |
| 5,898,621 A | * | 4/1999 | Takahashi et al. ...... 365/185.33 |
| 6,377,491 B2 | | 4/2002 | Otani et al. |
| 6,646,930 B2 | * | 11/2003 | Takeuchi et al. ............ 365/200 |
| 6,831,859 B2 | * | 12/2004 | Hosono et al. ......... 365/185.09 |
| 7,009,884 B2 | * | 3/2006 | Yaoi et al. .............. 365/185.22 |
| 2002/0008991 A1 | * | 1/2002 | Kanamitsu et al. ...... 365/185.03 |
| 2003/0058692 A1 | * | 3/2003 | Shiga .................... 365/189.09 |
| 2003/0151950 A1 | * | 8/2003 | Tamada et al. ......... 365/185.19 |
| 2004/0123132 A1 | * | 6/2004 | Montgomery et al. ....... 713/200 |
| 2004/0233731 A1 | * | 11/2004 | Yaoi et al. .............. 365/185.33 |
| 2005/0015539 A1 | * | 1/2005 | Horii et al. .................. 711/103 |
| 2005/0083735 A1 | * | 4/2005 | Chen et al. ............. 365/185.17 |

FOREIGN PATENT DOCUMENTS

| | | |
|---|---|---|
| CN | 1149183 A | 5/1997 |
| DE | 101 27 194 A1 | 12/2002 |
| JP | 11-176171 | 7/1999 |
| KR | 10-2001-0100793 | 11/2001 |

OTHER PUBLICATIONS

German Office Action mailed Feb. 16, 2007 for corresponding German Application No. 2004-66664.
Chinese Office Action dated Jul. 24, 2009 (with English Translation).

* cited by examiner

*Primary Examiner*—Thong Q Le
(74) *Attorney, Agent, or Firm*—Harness Dickey & Pierce, P.L.C.

(57) ABSTRACT

A method of verifying an initial state of a non-volatile memory device, a command for verify an initial state of a unit and a unit address corresponding to the unit received from a memory controller. An initial state of memory cells, which correspond to the unit address, is verified in response to the command. A verification result of the unit is transmitted to the memory controller.

14 Claims, 11 Drawing Sheets

FIG. 4
(CONVENTIONAL)
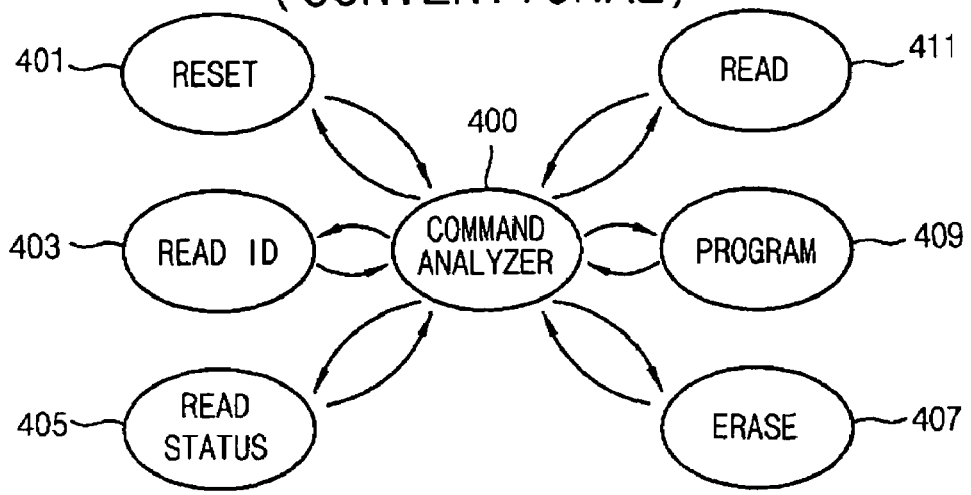

FIG. 13 (CONVENTIONAL)
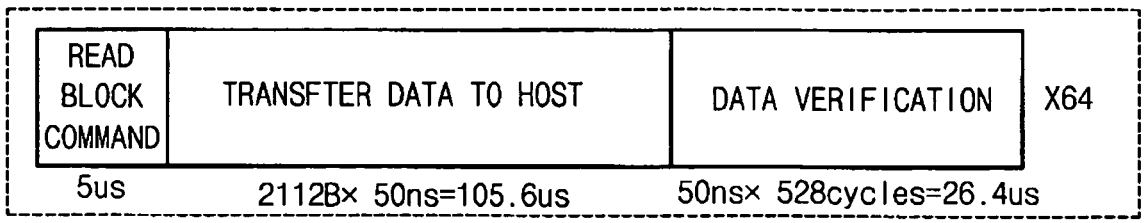
FIG. 15 (CONVENTIONAL)
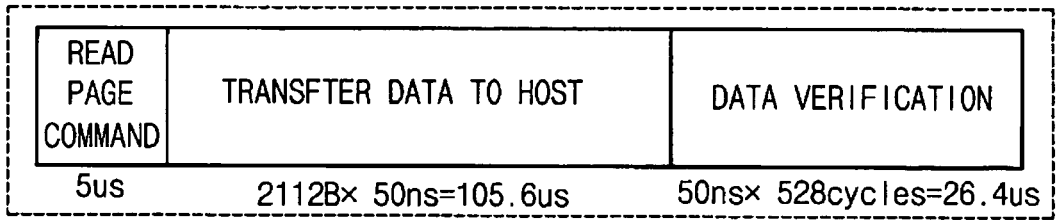

METHOD AND UNIT FOR VERIFYING INITIAL STATE OF NON-VOLATILE MEMORY DEVICE

CLAIM FOR PRIORITY

A claim of priority is made to Korean Patent Application No. 2004-66664 filed on Aug. 24, 2004, in the Korean intellectual property Office (KIPO), the entire contents of which are hereby incorporated by reference.

BACKGROUND OF THE INVENTION

1. Field of the Invention

Example embodiments of the present invention generally relate to a non-volatile memory device. More particularly, example embodiments of the present invention relate to a method and a unit to verify an initial state of a non-volatile memory device.

2. Description of the Related Art

Currently, electrically writable and erasable non-volatile memory (NVM) devices are used to store data in portable devices. The NVM device is generally divided into NOR-type and NAND-type architectures. The NVM may include memory cell transistors having a floating gate and a control gate.

A NOR-type NVM device may include a row of memory cells parallel coupled to a bit-line, with two neighboring memory cells sharing a bit-line contact and a common source line. A NOR-type NVM device may use a channel hot electron injection (CHEI) mechanism to perform program operations on the memory cells, and may use the Fowler-Nordheim (F-N) tunneling to perform erase operations. The NOR-type architecture may provide a device with a faster access speed, but with a smaller storage density and/or a larger cell current than an NAND device.

A NAND device may have cells connected in series between a bit line and a source line, and its cell size may be smaller compared to a NOR device. In the NAND device, programming may be achieved through F-N tunneling of electrons from a channel to a floating gate, and erasing may be accomplished by F-N tunneling of the electrons from the floating gate to the channel. A NAND-type architecture may provide a device with a slower access speed, but with a higher storage density and/or a smaller cell current than a NOR device.

In general, a non-volatile memory device may comprise a memory cell array. The memory cell array may have a plurality of blocks, and each block may have a plurality of pages. A block may be defined as a minimum unit required to be erased in order to perform an erase operation on data stored in the memory cells. One block may include, for example, 16 pages or 32 pages.

When a conventional NVM device performs a process to verify an initial state of a particular block(s) or particular page(s), an external memory controller the NVM device may read the entire data of the particular block(s) or the particular page(s) from the NVM device. Thus, the memory controller may require substantial time to read the entire data of the particular block(s) or page(s) from the NVM device.

In order to verify whether data of a particular block is in an initial state, a memory controller may read data of a page of a particular block in response to a read command. The memory controller may perform a process of verifying the initial state of the read data of the page. The memory controller may repeatedly perform the read operation and the verifying operation depending on the number of pages constituting the particular block.

When the data read from a particular block is not in the initial state, the block may be determined as a "dirty" block. When the data read from a particular block is "clean," the block may be determined to be in the initial state.

In a conventional verifying process, fetching data from the NVM device by the memory controller may be a time-consuming step. When the NVM device is power off, the NVM device generally performs a verifying process to restore data of the block(s) or page(s) to a previous state before the power-off. Accordingly, the conventional NVM device may waste a lot of time and/or current to perform the verifying process.

In other words, the verifying process may require a certain amount of time to read pages constituting a block, and additional time to verify the read pages.

Furthermore, the conventional NVM device may require dedicated memory space to perform the verifying process.

Facsimiles, printers, personal digital assistants (PDA), digital cameras, and/or other application products, which require data retention even after power is turned off, may require shorter verification time and/or lower current consumption.

If the verification time increases, the NVM device may not be compatible with a host system due to the long recovery time. For example, in a digital camera, when the verification time is long, the digital camera device may not be able detect a memory card mounted in the digital camera device because of overhead in a memory controller. Furthermore, when data is transferred via an interface between a memory interface and a NVM device during a verification process, abnormal operations may occur due to noise during the data transfer.

SUMMARY OF THE INVENTION

Embodiments of the present invention provide a method capable of verifying quickly and simply an initial state of block(s) or page(s) in a non-volatile memory device. Embodiments of the present invention also provide a control unit capable of verifying quickly and simply an initial state of block(s) or page(s) in a non-volatile memory device.

In an embodiment of the present invention, a method of verifying an initial state of a non-volatile memory device includes receiving a command to verify an initial state of a unit and a unit address corresponding to the unit from a memory controller, verifying an initial state of memory cells corresponding to the unit address in response to the command, and transmitting a verification result to the memory controller.

In another embodiment of the present invention, a method of verifying an initial state of a non-volatile memory device includes receiving a command to verify an initial state of a unit and a unit address corresponding to the unit from a memory controller, decoding the unit address in response to the command, determining whether threshold voltages of memory cells, which correspond to the unit address, is less than or equal to a first voltage level, determining the memory cells are in a writable state when the threshold voltages of the memory cells is less than or equal to the first voltage level; storing writable state information to a state register, and transmitting the writable state information to the memory controller in response to a request from the memory controller.

Yet in another embodiment of the present invention, a method of verifying an initial state of a non-volatile memory device includes receiving a command to verify an initial state of a unit and a unit address corresponding to the unit from a memory controller, decoding the unit address in response to the command, sensing data from memory cells, which correspond to the unit address, loading the sensed data to a unit register, determining the memory cells are in a writable state when all data of the unit register have a first logic value, and determining the memory cells are not in a non-writable state when all data of the unit register do not have the first logic value, storing information of the writable state to a state register, and transmitting the writable state information to the memory controller in response to a request from the memory controller.

In an embodiment of the present invention, a control unit adapted to verify an initial state of a non-volatile memory device includes a verification circuit adapted to receive a command to verify an initial state of a unit and a unit address corresponding to the unit from a memory controller, and adapted to verify an initial state of memory cells, which correspond to the unit address, in response to the command, and a state register configured to store a result of an initial state verification of every block.

BRIEF DESCRIPTION OF THE DRAWINGS

Aspects of example embodiments of the present invention will become more apparent with the description of the detail example embodiments thereof with reference to the accompanying drawings, in which:

FIG. 4 is a diagram illustrating a command state of a command analyzer in the conventional NVM device;

FIG. 13 is a block diagram illustrating a verification time consumed in a conventional process for verifying an initial state of a block;

FIG. 15 is a block diagram illustrating a verification time consumed in a conventional process for verifying an initial state of a page.

DESCRIPTION OF EMBODIMENTS

Figure 1:
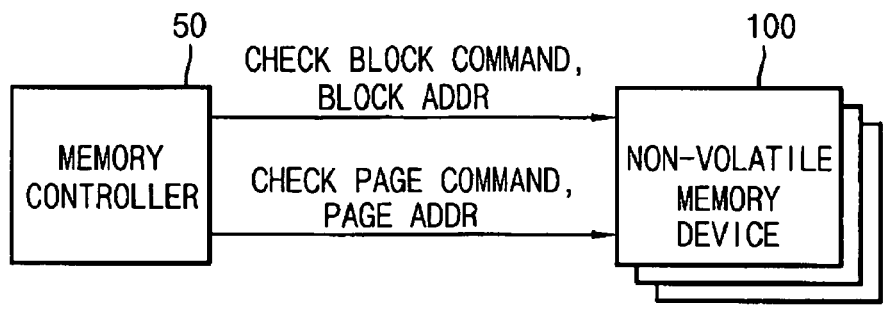
FIG. 1 is a block diagram illustrating an apparatus to verify an initial state of a non-volatile memory (NVM) device according to an example embodiment of the present invention.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

FIG. 1 is a block diagram illustrating an apparatus to verify an initial state of a non-volatile memory device according to an example embodiment of the present invention.

Referring to FIG. 1, a memory controller 50 may provide a command(s), such as a block address and a page address to a non-volatile memory (NVM) device 100. The command to verify an initial state of the NVM device may include a first command CHECK BLOCK to verify the initial state of a block(s), and a second command CHECK PAGE to verify an initial state of a page(s).

In addition, although not shown in FIG. 1, the memory controller 50 may provide various control signals, for example, /CE, /RE, /WE, CLE, ALE, and /WP to perform program, read, and erase operations, to the non-volatile memory device 100. The NVM device 100 may receive the various control signals, for example, /CE, /RE, /WE, CLE, ALE and /WP, and as well the first command CHECK BLOCK, and the second command CHECK PAGE, and performs the process of initial state verification.

Figure 6:
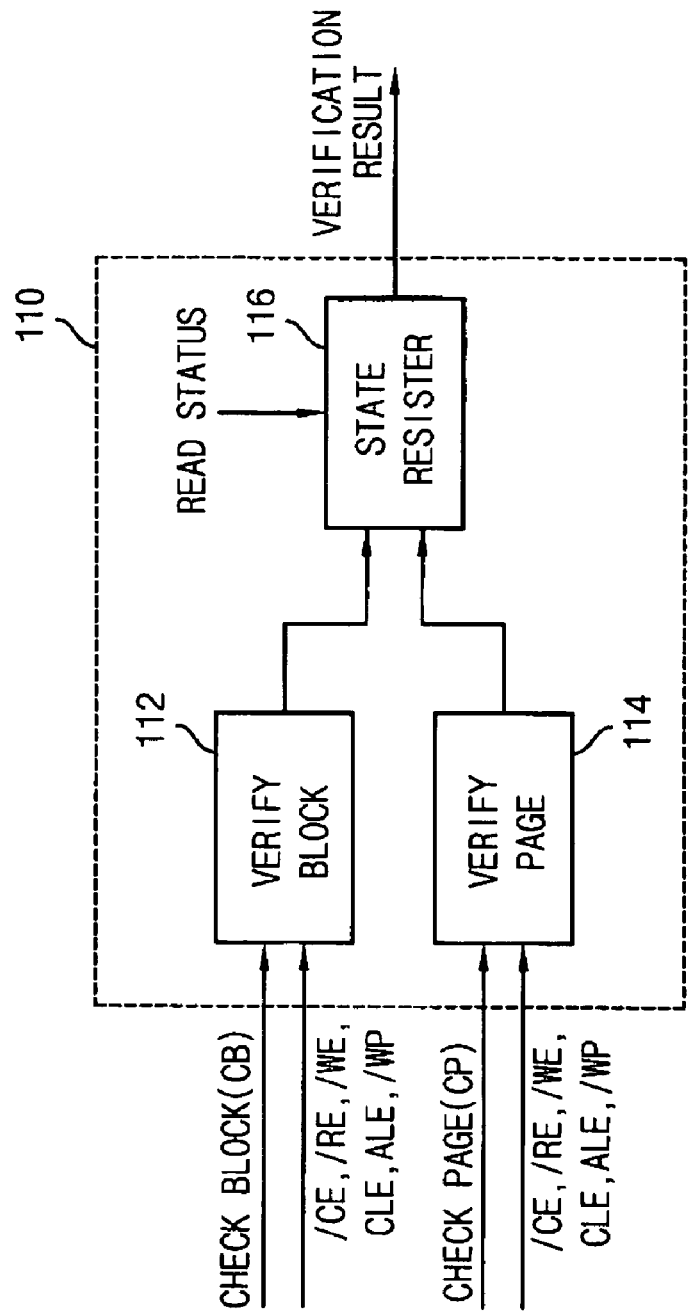
FIG. 6 is a block diagram illustrating a structure of a control unit included in a NVM device according to an example embodiment of the present invention.

The non-volatile memory device 100 may store process results ("pass" or "fail") of the initial state verification in a state register 116 (FIG. 6).

When the memory controller 50 provides a command to the NVM device 100 such as READ and STATUS commands to read data of the state register 116, the NVM device 100 provides process results of the initial state verification stored in the state register 116 to the memory controller 50.

The memory controller 50 receives the process results and verifies whether a corresponding block or page is in an initial state.

Figure 2:
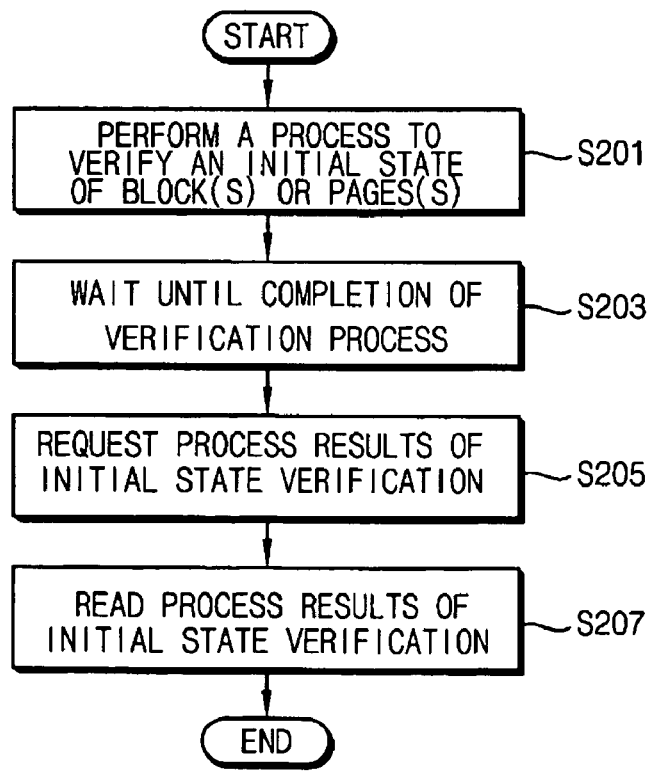
FIG. 2 is a flowchart illustrating a process to verify an initial state of a NVM device performed by a memory controller according to an example embodiment of the present invention.

FIG. 2 is a flowchart illustrating a process for verifying an initial state of a NVM device performed by a memory controller according to an example embodiment of the present invention.

Referring to FIG. 2, the memory controller 50 may provide a first command CHECK BLOCK to verify an initial state of a block(s) and/or a second command CHECK PAGE to verify an initial state of a page(s) to the NVM device 100. The NVM device 100 performs the verification process to verify the initial state of the block(s) or a process to verify the initial state of the page(s) in response to the first command CHECK BLOCK and/or the second command CHECK PAGE (S201).

The memory controller 50 may be on standby until the NVM device 100 completes the verification process (S203).

When the verification process by the NVM device 100 is completed, the memory controller 50 requests the process results of the initial state verification from the non-volatile memory device 100 (S205).

The memory controller 50 reads the process results of the initial state verification to verify whether a corresponding block or page is in the initial state (S207).

Figure 3:
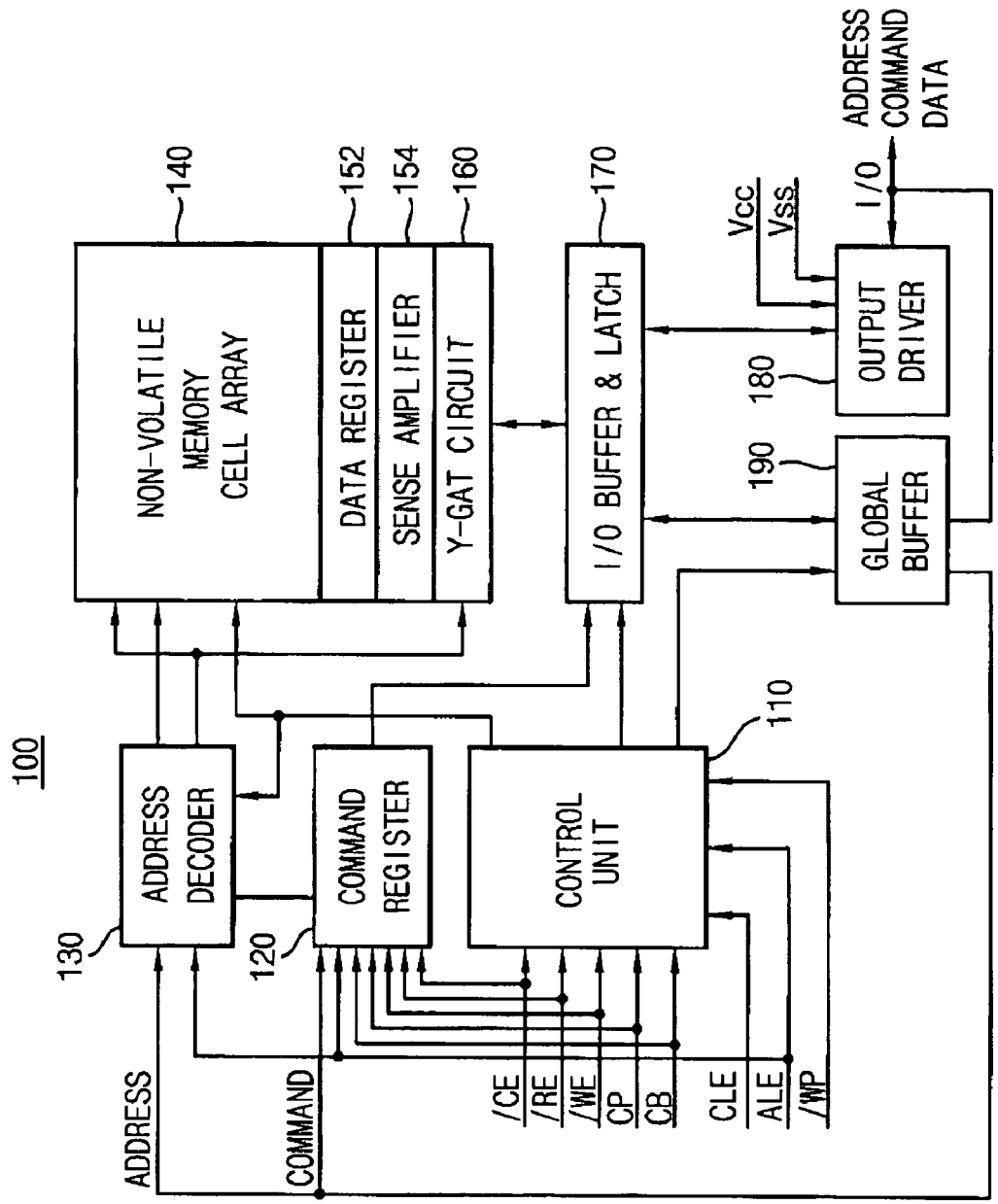
FIG. 3 is a block diagram illustrating a NVM device according to an example embodiment of the present invention.

FIG. 3 is a block diagram illustrating an internal structure of a NVM device according to an example embodiment of the present invention.

Referring to FIG. 3, the NVM device 100 may include a control unit 110, a command register 120, an address decoder 130, a NVM cell array 140, a data register 152, a sense amplifier 154, a Y-gating circuit 160, an I/O buffer & latch 170, an output driver 180, and a global buffer 190.

The control unit 110 may control program, erase, and read operations. The control unit 110 also controls processes related to an initial state verification process on a plurality of memory cells in the NVM cell array 140 based on control signals such as /CE (chip enable), /RE (read enable), /WE (write enable), CLE (command latch enable), ALE (address latch enable), and /WP (write protect) provided by the external memory controller 50.

The CLE (Command Latch Enable) signal and the ALE (Address Latch Enable) signal are used to select a command and address from an I/O pin.

The control unit 110 may include a high voltage generating circuit (not shown), which generates a high voltage used to perform the program, erase, and read operations. The high voltage is also used to perform as the process of the initial state verification on the plurality of memory cells. For example, the high voltage generating circuit (not shown) provides a program voltage Vpgm to a selected word line and also provides a pass voltage Vpass to a non-selected word line during a program operation mode.

Additionally, the high voltage generating circuit (not shown) provides a ground voltage to a selected word line and provides a read voltage Vread to a non-selected word line during a read operation mode.

The program voltage Vpgm, the pass voltage Vpass, and the read voltage Vread have a voltage level higher than a power supply voltage VDD. For example, the program voltage Vpgm is about 18 volts, the pass voltage Vpass is about 10 volts, and the read voltage is about 4.5 volts.

The control unit 110 may include the first verification circuit 112 to verify an initial state of a block(s), a second verification circuit 114 to verify an initial state of a page(s), and a state register 116). Detail description will follow with reference to FIG. 6.

The NVM device 100 writes commands to perform the program, read, and erase operations, and the initial state verification process to the command register 120, and the commend register 120 selects one among the program, read, and erase operations, and as well as the initial state verification process.

The address decoder 130 receives an address to perform the program, read and erase operations, and as well as the initial state verification process and decodes the address to provide a row address or a column address to the NVM cell array 140 and the Y-gating circuit 160.

The non-volatile memory cell array 140 comprises a plurality of blocks, each of the blocks having a plurality of pages.

The erase operation is performed in a unit of a block, and the program and read operation are performed in a unit of a page.

The data register or data buffer 152, which includes a plurality of page registers or page buffers, is coupled to the NVM cell array 140, and temporarily stores data transferred between the I/O buffer and the NVM cell array 140 during page read/program operations.

The sense amplifier 154 compares a reference current with a current of the NVM cell array 140 via bit lines to sense data from the NVM cell array 140 during a read operation mode.

The Y-gating circuit 160 receives decoded column addresses from the address decoder 130 to select some bit lines among bit lines BL1, BL2, . . . , and BLi corresponding to the decoded column address.

A page register corresponding to the selected bit lines is selected. Data bits that are read during the read operation to be stored in the selected page registers are provided to the Y-gating circuit 160.

After the command, address, and data are inputted via the I/O pin to be temporarily stored in the global buffer 190, the command, address, and data may be provided to the I/O buffer & latch 170, and then to the address decoder 130 and the commend register 120. Read data are passed through the I/O buffer & latch 170 to be outputted to the I/O pin via the output driver 180.

Figure 5:
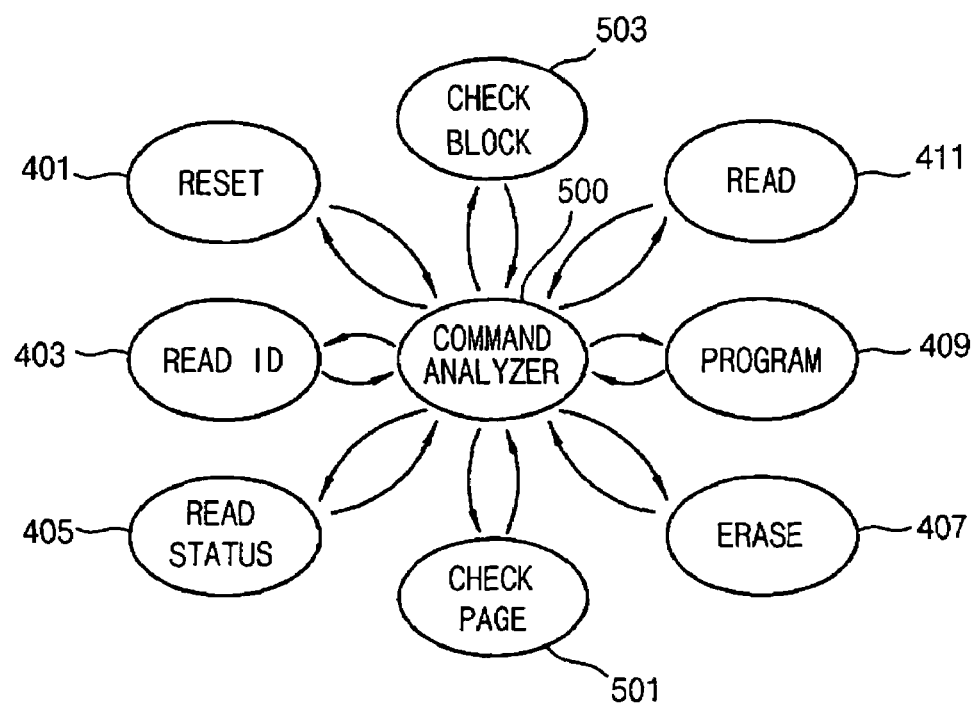
FIG. 5 is a diagram illustrating a command state of a command analyzer in a NVM device according to an example embodiment of the present invention.

FIG. 4 is a diagram illustrating a command state machine of a command analyzer in a conventional NVM device, and FIG. 5 is a diagram illustrating a command state machine of a command analyzer in a NVM device according to an example embodiment of the present invention.

In general, the command analyzer is provided in a control unit 110 of a NVM device and analyzes various commands received from a memory controller.

A command analyzer 400 of the conventional NVM device analyzes (or decodes) RESET 401, READ ID 403, READ STATUS 405, ERASE 407, PROGRAM 409, and READ 411 commands.

A command analyzer 500 according to an example embodiment of the present invention is placed in the control unit 110 and analyzes CHECK BLOCK 503 command to verify an initial state in a unit of a block, and CHECK PAGE 501 command to verify an initial state in a unit of a page, and in addition to analyzing the conventional commands.

FIG. 6 is a block diagram illustrating a structure included in a NVM memory device according to an example embodiment of the present invention.

The control unit 110 may include a first verification circuit 112 to verify an initial state in a unit of a block, a second verification circuit 114 to verify an initial state in a unit of a page, and a state register 116.

The first verification circuit 112 may receive control signals, such as /CE, /RE, /WE, CLE, ALE, /WP, and a CB (check block) command to verify the initial state of the block (s), and provides a result ("PASS" or "FAIL") of the initial state verification to the state register 116.

The second verification circuit 114 receives control signals, such as /CE, /RE, /WE, CLE, ALE, /WP, and a CP (check page) command to verify the initial state of the page(s), and provides a result ("PASS" or "FAIL") of the initial state verification to the state register 116.

The state register 116 stores the results of the initial state verification of the block(s) or page(s) and outputs the results in response to a READ STATUS command.

The control unit 110 may further include a high voltage generating circuit (not shown) that generates a high voltage, which is used for program, erase and read operations, and as well as used in the initial state verification process.

Figure 7:
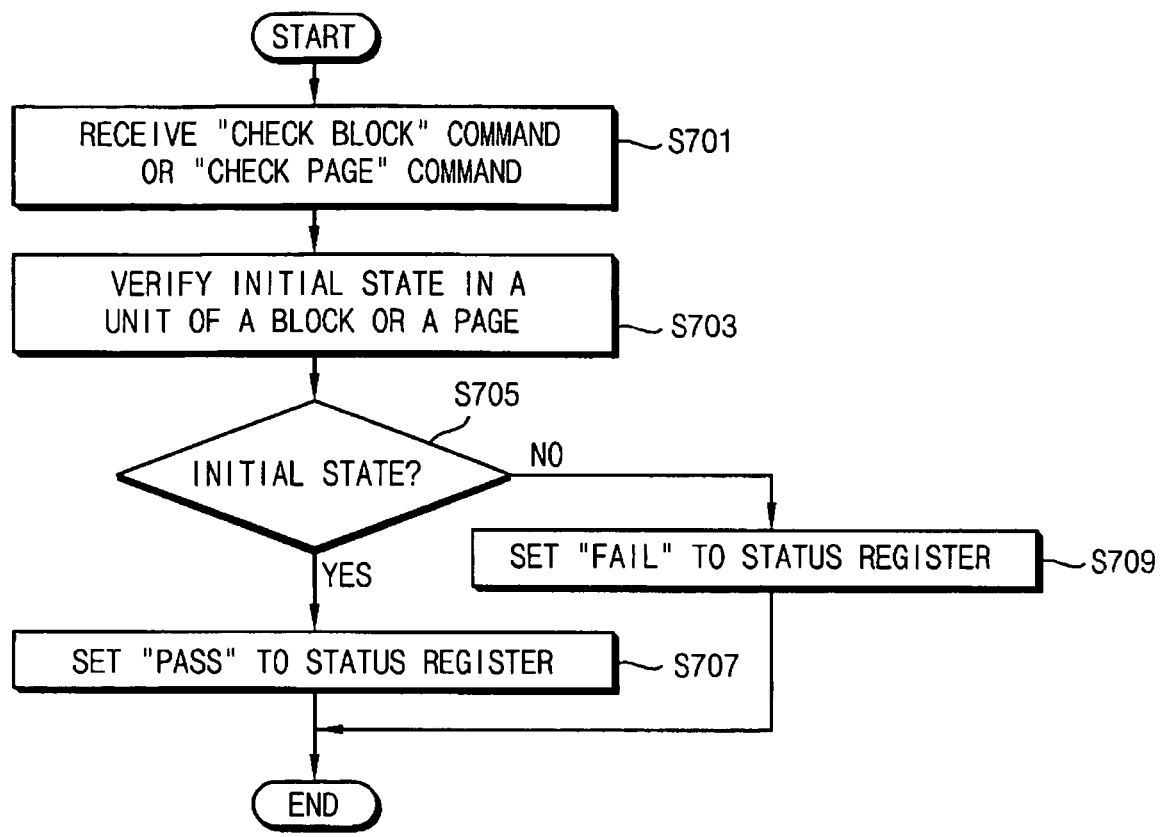
FIG. 7 is a flowchart illustrating a process for verifying an initial state performed in a NVM device according to an example embodiment of the present invention.

FIG. 7 is a flowchart illustrating a process of an initial state verification performed in a program, erase, and read operations device according to an example embodiment of the present invention.

Referring to FIG. 7, the NVM device 100 receives a first command CHECK BLOCK to verify an initial state of a block(s) or a second command CHECK PAGE to verify an initial state of a page(s) from the memory controller 50 (S701).

The NVM device 100 performs a process of verifying the initial state of the block(s) or the page in response to the first command CHECK BLOCK or the second command CHECK PAGE, respectively (S703).

The NVM device 100 determines whether the corresponding block or page has an initial state (S705).

When the corresponding block or page is determined to be in the initial state, the NVM device 100 sets "PASS" to the state register 116 (S707). A block or page in an initial state represents that the corresponding block or page is in a writable status. In other words, the initial state of the corresponding block or page represents a normal erased state.

When the corresponding block or page is determined to not be in the initial state, the NVM device 100 sets "FAIL" to the state register 116 (S709).

The NVM device 100 transfers the result of the initial state verification stored in the state register 116 to the memory controller 50.

However, in the method of verifying the initial state according to an example embodiment of the present invention, the initial state verification process is performed in the NVM device 100, and the result of the initial state verification is transferred to the memory controller 50. Therefore, the method of verifying the initial state according to an example embodiment of the present invention may be faster as compared with the conventional initial state verification method.

Figure 8:
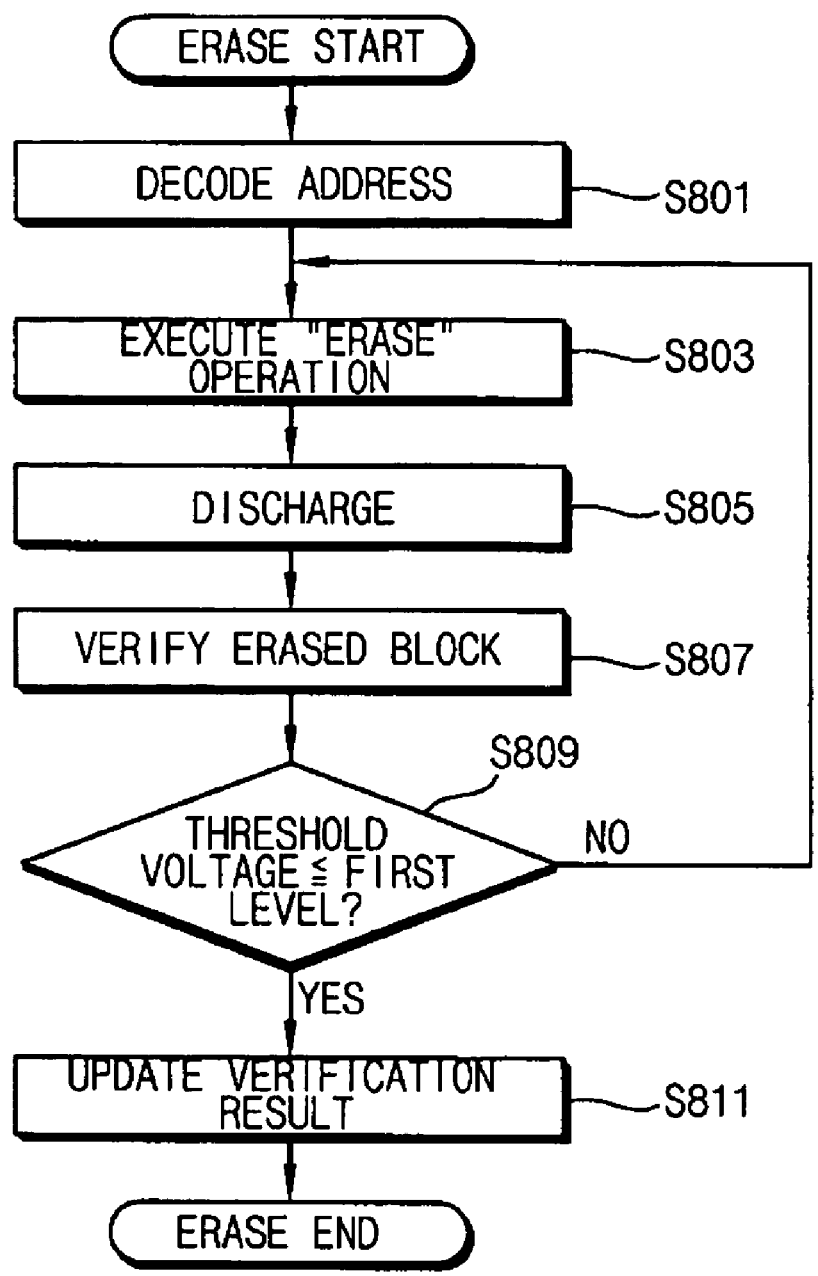
FIG. 8 is a flowchart illustrating a block erase-operation of a NVM device according to an example embodiment of the present invention.

FIG. 8 is a flowchart illustrating a block erase-operation of a NVM device according to an example embodiment of the present invention.

During an erase operation of a NVM device, a high voltage generating circuit (not shown) of the control unit 110 provides a high voltage to a substrate of a memory cell transistor until a control electrode of the memory cell transistor reaches a voltage level lower than or equal to a threshold voltage Vth. Then in the NVM device, electrons charged at a floating gate of a selected memory cell transistor pass through the substrate by F-N tunneling. As a result, the memory cell where the erase operation is performed has a logic "1". The erase operation is performed on every block.

In response to an erase command, the control unit 110 provides a block address corresponding to a block to be erased to the address decoder 130, and the address decoder 130 decodes the block address (S801).

Then an erase operation is performed on the memory cells corresponding to the block address (S803).

High voltage outputted from the high control generating circuit (not shown) of the control unit 110 is deactivated to prevent a memory cell transistor from performing a discharge operation (S805).

The block erase circuit (not shown) of the control unit 110 performs a process of verifying that the block is erased (S807).

The NVM device 100 determines whether a threshold voltage of the memory cell erased by the block erase circuit is less than or equal to a first voltage level (for example, +3 volts), and then determines whether the erase operation must be performed again (S809).

When the threshold voltage of the erased memory cell is less than or equal to the first voltage level, the erase operation is completed, the verification result of the block erase operation is stored in the state register 116, and the verification result is updated (S811).

When the threshold voltage of the erased memory cell is larger than the first voltage level, the process flow goes back to S803 so as to repeat the erase operation until the threshold voltage of the erased memory cell is less than or equal to the first voltage level.

Figure 9:
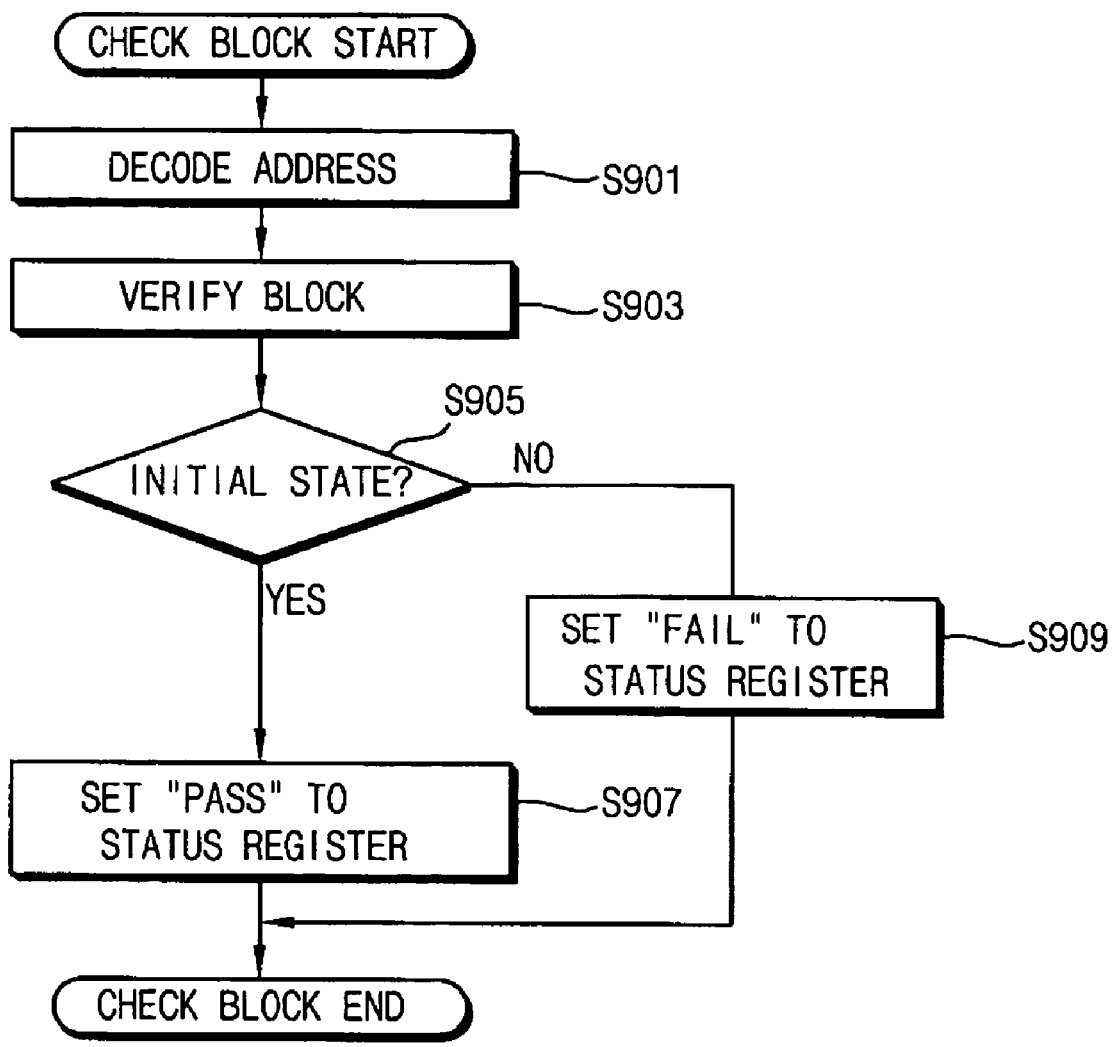
FIG. 9 is a flowchart illustrating a process for verifying an initial state of a block according to an example embodiment of the present invention.

FIG. 9 is a flowchart illustrating a process of an initial state verification according to an example embodiment of the present invention.

In an embodiment of the present invention, a cycle of the process for verifying an initial state of a block may be performed by omitting the block erase operation S803 and S805 in the cycle of the erase command of FIG. 8.

In a process cycle to verify an initial state of a block, the control unit 110 provides a block address corresponding to a block to be verified into the address decoder 130 in response to the first verification command, and the address decoder 130 decodes the block address (S901).

The first verification circuit 112 performs a process to verify the initial state of the block (S903).

The first verification circuit 112 determines whether a memory cell corresponding to the block address is in the initial state (S905). For example, the first verification circuit 112 determines whether a threshold voltage of the memory cell corresponding to the block address is less than or equal to a first voltage level, and the memory cell corresponding to the block address is determined to be in an initial state when the threshold voltage of the memory cell is less than or equal to the first voltage level.

When the memory cell corresponding to the block address is in an initial state, the NVM device 100 sets "PASS" to the state register 116 (S907), when the memory cell corresponding to the block address is not in an initial state, the NVM device 100 sets "FAIL" to the state register 116 (S909).

The verification result ("PASS" or "FAIL") stored in the state register 116 is transmitted to the memory controller 50, and then a user can verify the verification result at the memory controller 50.

As a result, when a user inputs a verification command to verify an initial state of a block and a block address, the process for verifying the initial state of the block is performed, the verification result is stored in the state register 116, and the user can readily retrieve the verification result.

Figure 10:
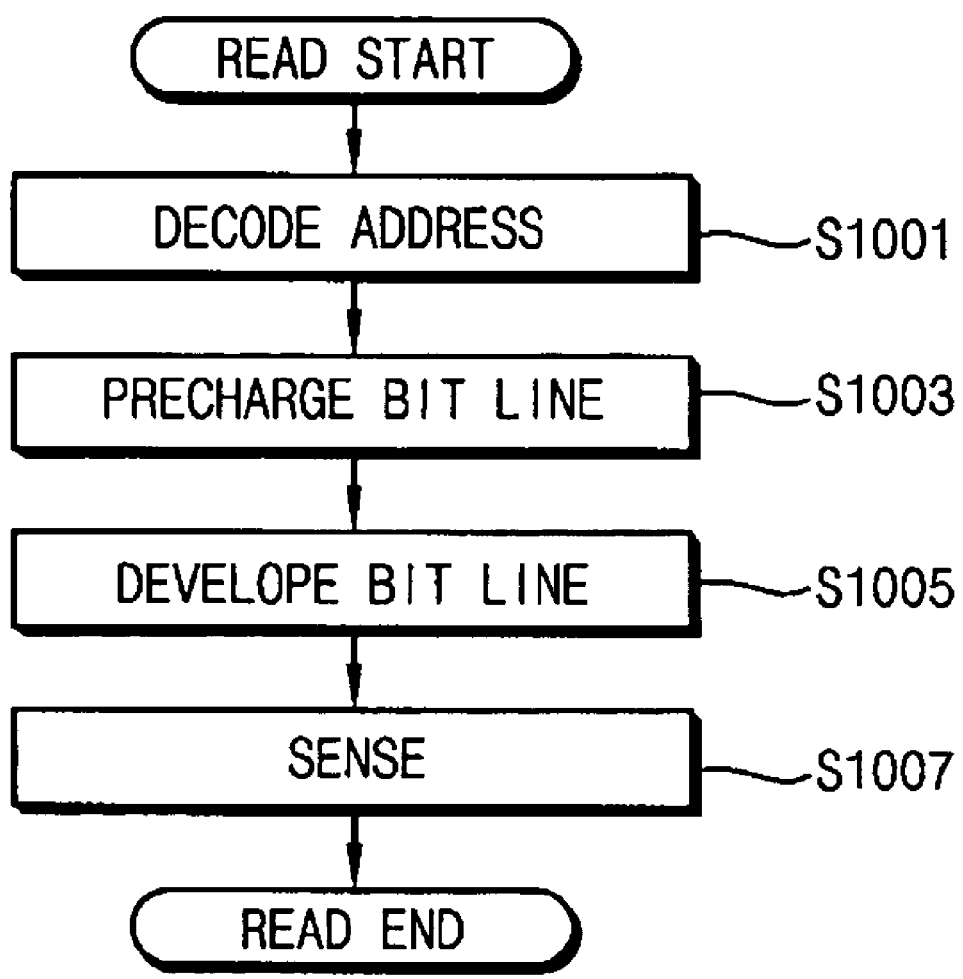
FIG. 10 is a flowchart illustrating a read operation of a NVM device according to an example embodiment of the present invention.

FIG. 10 is a flowchart illustrating a read operation of a NVM device according to an example embodiment of the present invention.

In a NVM device, a read operation is performed based on whether a threshold voltage is changed depending upon a state (programmed or erased) of a selected memory cell.

That is, a ground voltage is applied to a selected word line and when a selected memory cell is an off-cell (i.e., a programmed cell), current does not pass through the memory cell; and when a selected memory cell is an on-cell (i.e., an erased cell), current passes through the memory cell.

The NVM device reads data having a logic level "0" (programmed state) or a logic level "1" (erased state) by detecting a voltage of a bit line. The voltage of the bit line varies depending upon the current flow based on the state of the memory cell.

In a read operation cycle, the control unit 110 provides an address corresponding to a page to be read into the address decoder 130 in response to a read command, and then the address decoder 130 decodes the address (S1001).

The bit line is precharged (S1003), and the bit line is developed (S1005). The sense amplifier S/A 154 compares a reference current with a current of the selected memory cell via the bit lines to sense data from the memory cell array 140 (S1007).

The sensed data are loaded to the page buffer, transmitted to the I/O buffer & latch 170, and then outputted.

Figure 11:
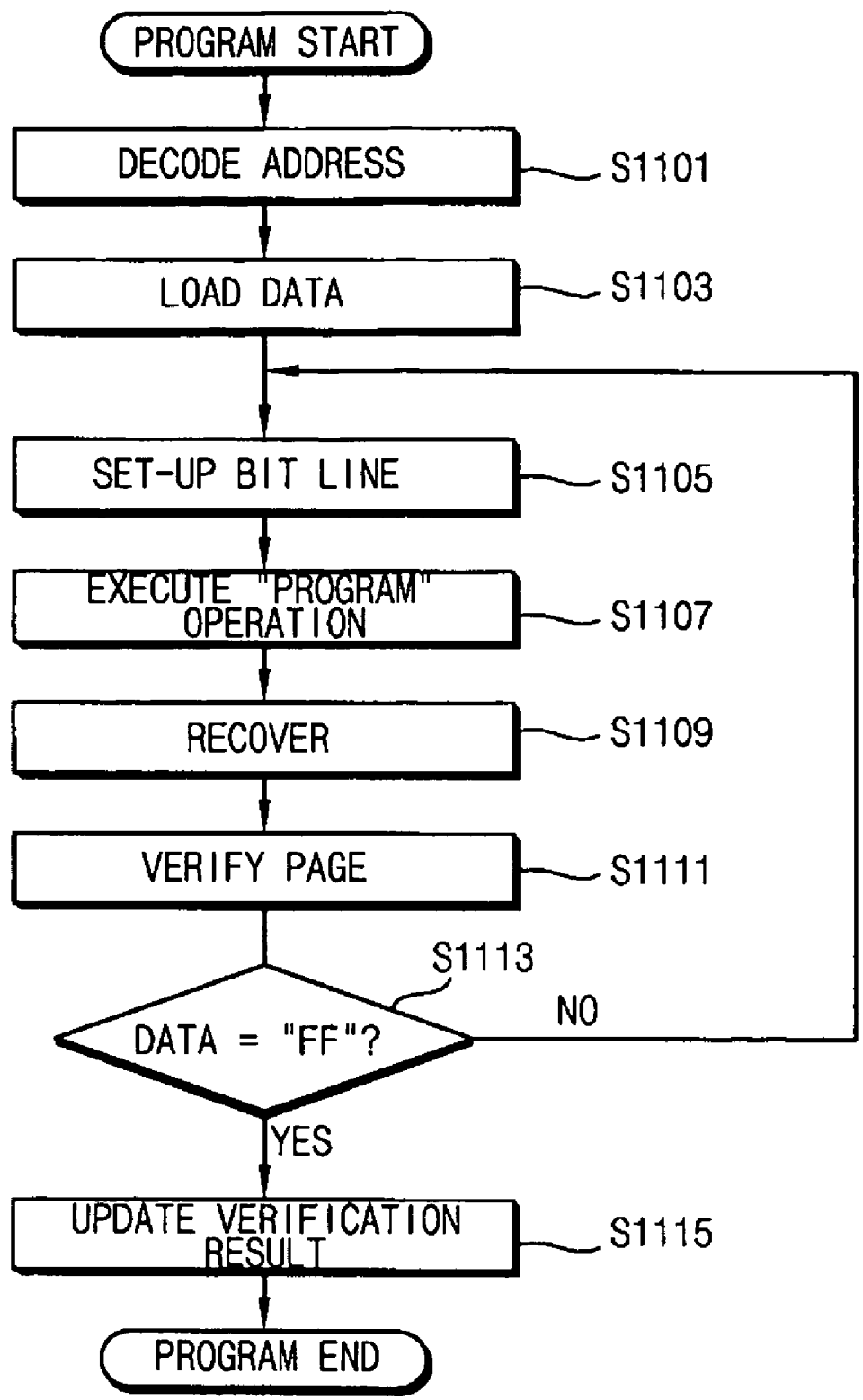
FIG. 11 is a flowchart illustrating a program operation of a NVM device according to an example embodiment of the present invention.

FIG. 11 is a flowchart illustrating a program operation of a NVM device according to an example embodiment of the present invention.

In the program operation of the NVM device, a voltage higher than or equal to a threshold voltage Vth is applied to a control gate of a selected memory cell transistor, electrons are injected to a floating gate of the selected memory cell transistor, and an electronic layer is formed, as a result, a corresponding memory cell has a data of a logic level "0".

In a program operation cycle, the control unit 110 provides an address corresponding to a page to be programmed to the address decoder 130 in response to a program command, and then the address decoder 130 decodes the address (S1101).

A byte of data to be programmed pass through the I/O buffer & latch 170, and are loaded to a corresponding page register (S1103).

In order to perform a program operation on a bit line BL of the NVM cell array 140, a ground voltage is applied to the bit line BL so as to set up the bit line BL, and then a program voltage Vpgm, for example about 18 volts, is applied to selected word lines (S1105).

The loaded data are programmed to memory cells corresponding to the selected page (S1107).

High voltage outputted from the high control generating circuit (not shown) of the control unit 110 is deactivated to prevent a memory cell transistor from performing a discharge operation (S1109).

When a memory cell data corresponding to a page is identical with a corresponding data of a page register where the programmed data is written, a logic level "1" is written into the data register.

A program circuit (not shown) of the NVM device 100 performs a process to verify an initial state of a page by determining whether the data register has all logic level "1" such as "FF" (S1113).

When the content of the data register is "FF", the program operation is completed and "PASS", representing that the program is completed is set to the state register 116 (S1115).

When the content of the data register is not "FF", the process goes back to S1105 and repeats the program operation until the content of the data register is "FF".

Figure 12:
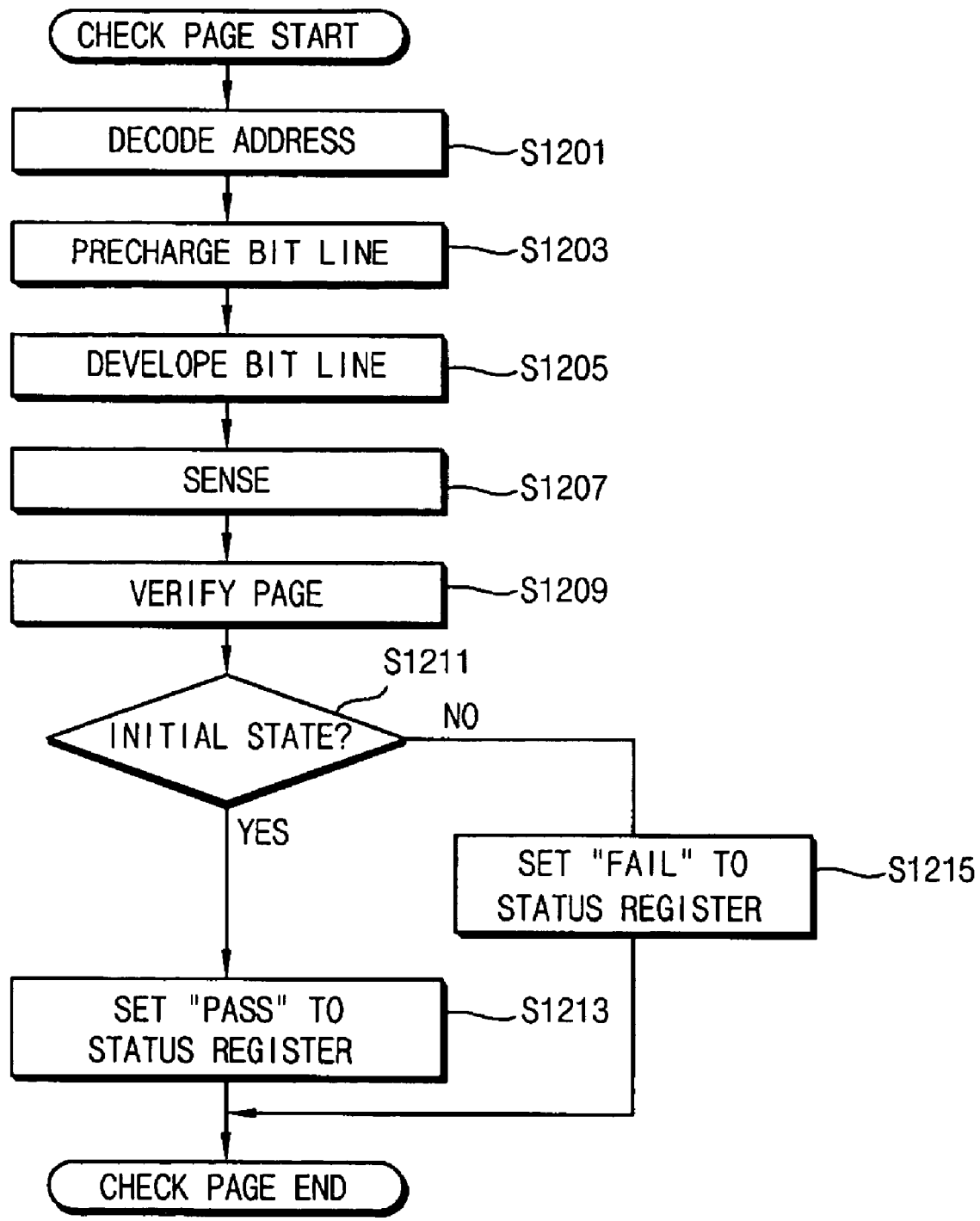
FIG. 12 is a flowchart illustrating a process for verifying an initial state of a page according to an example embodiment of the present invention.

FIG. 12 is a flowchart illustrating a process for verifying an initial state of a page according to an example embodiment of the present invention.

In an embodiment of the present invention, a process cycle to verify an initial state of a page can be performed by partially combining operations of the read operation cycle of FIG. 10 and the program operation cycle of FIG. 11. In other words, the command to verify an initial state of a page may be implemented using logic circuits for general read and program commands.

A process cycle to verify an initial state of a page can determine whether a corresponding page is in an initial state or not by performing a process (Verify Page) of verifying the initial state of the page used in the program command while data of memory cells are moved into the page register in the conventional read command.

In detail, the control unit 110 provides an address corresponding to a page to be verified in response to a command to verify an initial state of a page to the address decoder 130, and the address decoder 130 decodes the address (S1201).

A bit line is pre-charged (S1203), and the pre-charged bit line is developed (S1205). The sense amplifier S/A 154 senses data from a selected memory cell according to a corresponding page (S1207).

The sensed data is loaded to the page register. The second verification circuit 114 performs a process to verify the initial state of the page (S1209).

The NVM device 100 determines whether the sensed data of the corresponding page is in an initial state or not (S1211). For example, when a content of the page register is "FF", the page is determined to be in an initial state, and when a content of the page register is not "FF", the page is determined to be in a non-initial state. For example, a circuit to determine whether a content of the page register is "FF" or not may be implemented using a logical AND circuit.

When the page is determined to be in the initial state, the non-volatile memory device 100 sets "PASS" to the state register 116 (S1213).

When the page is determined to be in the non-initial state, the NVM device 100 sets "FAIL" to the state register 116 (S1215).

The result ("PASS" or "FAIL") is transmitted to the memory controller 50; therefore, a user can verify the process result at the memory controller 50.

FIG. 13 is a block diagram illustrating a verification time required to verify an initial state of a block accordingly to the conventional process.

For example, it is assumed that a NVM device access time is about 50 ns (per byte), a memory controller clock speed is about 20 Mhz (50 ns per clock), a duration during which the non-volatile memory device receives a command from the memory controller is about 5 us, and the NVM device block size is about (2048+64)×64 KB. When data of the NVM device having about 2 KB page is verified by the conventional method, the time required to verify an initial state of a block is (5+105.6+26.5) us×64=8768 us as shown in FIG. 13. In other words, as much as 8.768 ms is required.

Figure 14:
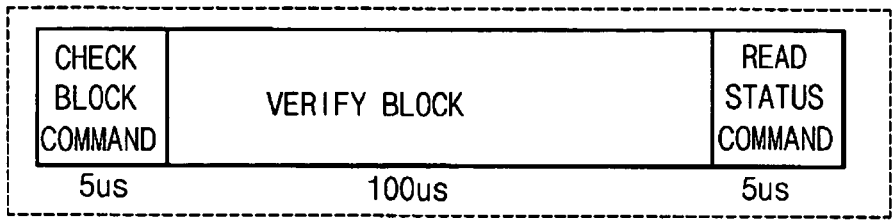
FIG. 14 is a block diagram illustrating a verification time consumed in a process for verifying an initial state of a block according to an example embodiment of the present invention.

FIG. 14 is a block diagram illustrating a verification time required in a process to verify an initial state of block according to an example embodiment of the present invention.

Referring to FIG. 14, the time required during a start of the verification process and the time required during a process to receive the verification result are not much different than the conventional verification process. However, the time required during the verification process may be reduced by about 110 us, because the process to verify an initial state of a block is performed in the NVM device 100 instead of in the memory controller 50.

Accordingly, the time required during the process for verifying an initial state of a block may be reduced by as much as about 79 times as compared to the conventional process.

FIG. 15 is a block diagram illustrating a verification time required to verify an initial state of a page according to the conventional process.

Referring to FIG. 15, when data of the NVM device having about 2 KB page is verified by the conventional method, the time required is (5+105.6+26.5) us=137 us.

Figure 16:
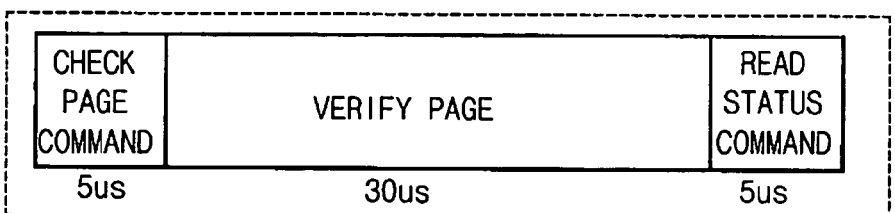
FIG. 16 is a block diagram illustrating a verification time consumed in a process for verifying an initial state of a page according to an example embodiment of the present invention.

FIG. 16 is a block diagram illustrating a verification time required in a process to verify an initial state of a page according to an example embodiment of the present invention.

Referring to FIG. 16, the time required in the verification process is reduced by about 40 us, because the process for verifying an initial state of a page is performed in the NVM device 100 instead of in the memory controller 50.

Accordingly, the time required during the process to verify an initial state of a page is reduced by 3 times as compared to the conventional process.

According to a method of performing a process to verify an initial state of a NVM device, a process for verifying an initial state of a block(s) or page(s) may be performed by new commands.

The process to verify an initial state of a block(s) or page(s) is performed in a NVM device instead of in a memory controller. And then, a non-volatile memory device transmits the result of the verification process to a memory controller. Consequently, the NVM device according to example embodiments of the present invention can quickly and simply verify an initial state of a particular unit, i.e., a block or a page.

Additionally, current consumption is reduced, because a memory included in the memory controller is not used to perform the verification process. Also, implementation cost may be reduced, because the verification process may be performed using the conventional page verifying circuit and the conventional block verifying circuit that are implemented to perform a program operation and an erase operation in a NVM device.

Furthermore, since data are not transmitted via an interface between a NVM interface and a memory controller during the verification process, errors due to system noise may be prevented.

While the example embodiments of the present invention have been described in detail, it should be understood that various changes, substitutions and alterations may be made herein without departing from the scope of the invention.

What is claimed is:

1. A method of verifying an initial state of a non-volatile memory device, comprising:
    receiving a command to verify the initial state of a unit of the non-volatile memory device and a unit address corresponding to the unit of the non-volatile memory device from a memory controller;
    verifying the initial state of memory cells corresponding to the unit address in response to the command;
    transmitting a verification result to the memory controller; and
    storing the verification result to a state register, wherein
        the initial state includes an erased state,
        verifying the initial state further includes:
            decoding the unit address in response to the command; and
            determining whether data of the memory cells are in the initial state, and
        the unit is a page and the unit address is a page address.

2. The method of claim 1, wherein the memory cells are determined to be in the initial state when threshold voltages of the memory cells are less than or equal to a first voltage level.

3. The method of claim 1, wherein the verification result is transmitted to the memory controller in response to a request for the verification result from the memory controller.

4. The method of claim 1, wherein verifying the initial state further comprises:
    sensing data from the memory cells.

5. The method of claim 4, wherein the determining further comprises loading the sensed data to a page register.

6. The method of claim 5, wherein the memory cells are determined to be in the initial state when all the data of the page register have a logic level "1", and are determined not to be in the initial state when all the data of the page register do not have the logic level "1".

7. A method of verifying an initial state of a non-volatile memory device, comprising:
    receiving a command to verify the initial state of a unit of the non-volatile memory device and a unit address corresponding to the unit of the non-volatile memory device from a memory controller;
    decoding the unit address in response to the command;
    determining whether threshold voltages of memory cells, which correspond to the unit address, are less than or equal to a first voltage level;
    determining the memory cells are in a writable state when the threshold voltages of the memory cells is less than or equal to the first voltage level;
    storing writable state information to a state register; and transmitting the writable state information to the memory controller in response to a request from the memory controller, wherein the initial state includes an erased state.

8. The method of claim 7, wherein the unit is a block and the unit address is a block address.

9. A method of verifying an initial state of a non-volatile memory device, comprising:

receiving a command to verify the initial state of a unit of the non-volatile memory device and a unit address corresponding to the unit of the non-volatile memory device from a memory controller;

decoding the unit address in response to the command;

sensing data from memory cells, which correspond to the unit address;

loading the sensed data to a unit register;

determining the memory cells are in a writable state when all data of the unit register have a first logic value, and determining the memory cells are in a non-writable state when all data of the unit register do not have the first logic value;

storing information of the writable state to a state register; and transmitting the writable state information to the memory controller in response to a request from the memory controller, wherein the initial state includes an erased state.

10. The method of claim 9, wherein the first logic value corresponds to a logic level "1".

11. The method of claim 9, wherein the unit is a page and the unit address is a page address.

12. A control unit adapted to verify an initial state of a non-volatile memory device, comprising:

a verification circuit adapted to receive a command to verify the initial state of a unit of the non-volatile memory device and a unit address corresponding to the unit of the non-volatile memory device from a memory controller, and adapted to verify the initial state of memory cells, which correspond to the unit address, in response to the command, wherein the initial state includes an erased state and the verification circuit is adapted to determine the memory cells are in the initial state when threshold voltages of the memory cells are less than or equal to a first voltage level; and a state register configured to store a result of the initial state verification of the memory cells.

13. The control unit of claim 12, wherein the unit is a block and the unit address is a block address.

14. The control unit of claim 12, wherein the unit is a page and the unit address is a page address.

* * * * *